(12) United States Patent
Park et al.

(10) Patent No.: US 10,818,522 B2
(45) Date of Patent: Oct. 27, 2020

(54) PROCESS CHAMBER FOR A SUPERCRITICAL PROCESS AND APPARATUS FOR TREATING SUBSTRATES HAVING THE SAME

(71) Applicant: Samsung Electronics Co., Ltd., Suwon-si (KR)

(72) Inventors: Sang-Jine Park, Suwon-si (KR); Byung-Kwon Cho, Suwon-si (KR); Yong-Jhin Cho, Hwaseong-si (KR); Yong-Sun Ko, Suwon-si (KR); Yeon-Jin Gil, Daegu (KR); Kwang-Wook Lee, Seongnam-si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 277 days.

(21) Appl. No.: 15/978,303

(22) Filed: May 14, 2018

(65) Prior Publication Data
US 2019/0096712 A1 Mar. 28, 2019

(30) Foreign Application Priority Data
Sep. 22, 2017 (KR) .................... 10-2017-0122848

(51) Int. Cl.
*H01L 21/302* (2006.01)
*H01L 21/67* (2006.01)
*H01L 21/66* (2006.01)

(52) U.S. Cl.
CPC ...... *H01L 21/67092* (2013.01); *H01L 21/302* (2013.01); *H01L 21/6719* (2013.01);
(Continued)

(58) Field of Classification Search
CPC ............ H01L 21/302; H01L 21/67034; H01L 21/67092; H01L 21/6719; H01L 21/67253; H01L 22/12
(Continued)

(56) References Cited

FOREIGN PATENT DOCUMENTS

| JP | 2010010302 A | 1/2010 |
|---|---|---|
| JP | 2016039300 A | 3/2016 |

(Continued)

OTHER PUBLICATIONS

Sasaki et al., "JP2010010302A English Machine Translation.pdf", Jan. 14, 2010—Machine translation from Espacenet.com.*

*Primary Examiner* — Levon J Shahinian
(74) *Attorney, Agent, or Firm* — Muir Patent Law, PLLC

(57) ABSTRACT

Disclosed are a supercritical process chamber and an apparatus having the same. The process chamber includes a body frame having a protrusion protruding in an upward vertical direction from a first surface of the body frame and a recess defined by the protrusion and the first surface of the body frame; a cover frame; a buffer chamber arranged between the body frame and the cover frame; and a connector. The buffer chamber includes an inner vessel detachably coupled to the body frame providing a chamber space in the recess and an inner cover detachably coupled to the cover frame. The inner cover is in contact with a first surface of the inner vessel enclosing the chamber space from surroundings. The connector couples the body frame and the cover frame having the buffer chamber arranged therebetween such that the enclosed chamber space is transformed into a process space in which the supercritical process is performed.

17 Claims, 12 Drawing Sheets

(52) U.S. Cl.
CPC .. *H01L 21/67034* (2013.01); *H01L 21/67253* (2013.01); *H01L 22/12* (2013.01)

(58) Field of Classification Search
USPC ................................................. 134/200, 902
See application file for complete search history.

(56) References Cited

FOREIGN PATENT DOCUMENTS

| | | |
|---|---|---|
| KR | 10-20030043360 A | 6/2003 |
| KR | 10-0837627 A | 6/2008 |
| KR | 10-1048063 B1 | 7/2011 |
| KR | 10-1654627 B1 | 8/2016 |
| KR | 10-20170024216 A | 3/2017 |

\* cited by examiner

PROCESS CHAMBER FOR A SUPERCRITICAL PROCESS AND APPARATUS FOR TREATING SUBSTRATES HAVING THE SAME

CROSS-REFERENCE TO RELATED APPLICATIONS

This application claims priority under 35 U.S.C § 119 to Korean Patent Application No. 10-2017-0122848 filed on Sep. 22, 2017 in the Korean Intellectual Property Office, the contents of which are incorporated by reference herein in their entirety.

BACKGROUND

1. Field

An example embodiment relates to a process chamber and an apparatus for treating substrates, and more particularly, to a process chamber in which the substrates area treated by using a supercritical fluid and a substrate treating apparatus having the same.

2. Description of the Related Art

As the design rule of semiconductor devices decreases, various pattern defects tend to increase in a dry process after a wet process such as a wet etching process and a wet cleaning process due to a surface tension of a process liquid of the wet process. For example, the pattern on the wafer may collapse (collapse defect) or may make contact with an adjacent pattern like a bridge (bridge defect) due to the surface tension of an etchant of the wet etching process or a cleaning solution of the wet cleaning process.

For the above reason, the dry process for evaporating the process liquid off from the pattern has been widely performed to the pattern by using a supercritical fluid having both liquid and gas characteristics. In general, the supercritical fluid has high diffusivity just like a gas and simultaneously can function as a solvent without substantial influences of the surface tension. Thus, the supercritical fluid has been widely used for the recent dry processes.

A conventional supercritical dry chamber for performing the dry process by using the supercritical fluid (supercritical dry process) includes a lower chamber providing a process space for the supercritical dry process, an upper chamber detachably coupled to the lower chamber and isolating the process space from surroundings and a connector for attaching the lower chamber and the upper chamber with each other.

The connector may attach the lower chamber and the upper chamber to each other by such a sufficient external force that supercritical temperature and pressure sufficiently high for the supercritical state may be maintained in the process space when performing the supercritical drying process in the supercritical dry chamber. For example, the connector includes a lifter for lifting the lower chamber to the upper chamber and a hydraulic cylinder for applying a hydraulic power for combining the lower and the higher chambers.

Thus, the lower and the upper chambers are pressurized to each other at a contact portion by the hydraulic power, and the contact surfaces of the lower and the upper chambers tend to be grinded at the contact portion thereof. The surface grinding at the contact portion usually causes the increase of surface roughness, which results in the fluid leakage from the supercritical dry chamber and the pressure drop in the process space in the chamber. Consequently, the supercritical state is broken in the process space due to the high surface roughness. In addition, the surface grinding at the contact portion also generates metal contaminants caused by the friction between the contact surfaces of the lower and the upper chambers and the metal contaminants tend to flow into the process space when the substrate is loaded into the process chamber, which may cause various process defects in the supercritical dry process.

When the surface roughness of the contact surfaces of the lower and the upper chambers is deviated from an allowable condition, the contact surfaces are usually grinded and polished until the surface roughness is to meet the allowable condition. Thus, the repeated grinding and polishing to the contact surfaces eventually lead to the exchange of the lower and the upper chambers, which increases the maintenance cost of the supercritical dry chamber.

Particularly, although the surface roughness tends to be intensively deteriorated at the local area of the contact surfaces around the hydraulic cylinder, both of the lower and the upper chambers are wholly exchanged with new ones instead of the grinded contact portion thereof due to the configuration limitations that the lower chamber and the upper chamber are integrally coupled with each other by the connector.

SUMMARY

Example embodiments of the present inventive concept provide a supercritical process chamber having a lower chamber, an upper chamber and a detachable buffer chamber for preventing a direct contact between lower and upper chambers and defining a process space of the process chamber, to thereby preventing the surface grinding between the lower and the upper chambers.

Other example embodiments of the present inventive concept provide an apparatus for treating substrates with which the above supercritical process chamber may be provided.

According to exemplary embodiments of the inventive concept, there is provided a supercritical process chamber including a body frame having a protrusion protruding in an upward vertical direction from a first surface of the body frame and a recess defined by the protrusion and the first surface of the body frame; an inner vessel detachably coupled to the body frame such that the inner vessel is configured to be inserted into the recess covering the protrusion, the inner vessel providing a chamber space in the recess; a cover frame; an inner cover detachably coupled to the cover frame such that the inner cover is configured to be in contact with a first surface of the inner vessel enclosing the chamber space from surroundings; and a connector configured to couple the body frame and the cover frame having the inner vessel and the inner cover sequentially arranged between the body frame and the cover frame in the upward vertical direction from the first surface of the body frame such that the enclosed chamber space is transformed into a process space in which the supercritical process is performed.

According to other exemplary embodiments of the inventive concept, there is provided an apparatus for treating substrates including a process chamber having a process space in which the substrate may be processed by using a supercritical fluid, a supply module supplying the supercritical fluid into the process space from an exterior of the process chamber, and a process controller connected to the process chamber and the supply module and controlling a flow of the supercritical fluid according to process conditions in the process space. The process chamber may include a body frame having a protrusion protruding in an upward vertical direction from a first surface of the body frame and a recess defined by the protrusion and the first surface of the body frame; an inner vessel detachably coupled to the body frame such that the inner vessel is configured to be inserted into the recess covering the protrusion, the inner vessel providing a chamber space in the recess; a cover frame; an inner cover detachably coupled to the cover frame such that the inner cover is configured to be in contact with a first surface of the inner vessel enclosing the chamber space from surroundings; and a connector configured to couple the body frame and the cover frame having the inner vessel and the inner cover sequentially arranged between the body frame and the cover frame in the upward vertical direction from the first surface of the body frame such that the enclosed chamber space is transformed into a process space in which the supercritical process is performed.

According to other exemplary embodiments of the inventive concept, there is provided a process chamber including a body frame having a protrusion protruding in an upward vertical direction from a first surface of the body frame and a recess defined by the protrusion and the first surface of the body frame; a cover frame; a buffer chamber arranged between the body frame and the cover frame; and a connector. The buffer chamber includes an inner vessel detachably coupled to the body frame providing a chamber space in the recess and an inner cover detachably coupled to the cover frame. The inner cover is in contact with a first surface of the inner vessel enclosing the chamber space from surroundings. The connector couples the body frame and the cover frame having the buffer chamber arranged therebetween such that the enclosed chamber space is transformed into a process space in which the supercritical process is performed.

According to example embodiments of the present inventive concept, the process chamber may include a body and a cover that may be coupled to each other by a compressive force. The body may include the body frame and the inner vessel that may be detachably coupled to the body frame and the cover may include the cover frame and the inner cover that may be detachably coupled to the cover frame. The body and the cover may be coupled into the process chamber by the compressive force in such a configuration that the inner vessel may make contact with the inner cover without direct contact between the body frame and the cover frame. Thus, when the contact surface of the inner vessel and the inner cover may be grinded and damaged by the compressive force and the contaminant particles may be generated from the contact area together with the increase of the surface roughness, the inner vessel and the inner cover may be exchanged with new ones without exchanging the body frame and the cover frame. Accordingly, the damage or defect such as the high surface roughness of the contact area of the body and cover may be removed while the main body of the process chamber may still remain unchanged.

In addition, even when the contaminant particles may be generated from the contact area of the body and the cover of the process chamber, the inner vessel and the inner cover may be exchanged with new ones, so that the contaminant particles may be thoroughly prevented from flowing into the process space and thus the process defects due to the contaminant particles may be reduced in the supercritical process.

Particularly, when the body contact of the inner vessel and the cover contact of the inner cover may be individually provided with the process chamber as the body contact piece and the cover contact piece, the body contact and the cover contact may be locally exchanged instead of the whole of the body contact and the cover contact according to the individual and local failures thereof. Accordingly, the maintenance cost of the process chamber may be reduced and the exchange facility of the inner vessel and the inner cover may be improved by the body contact piece and the cover contact piece.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
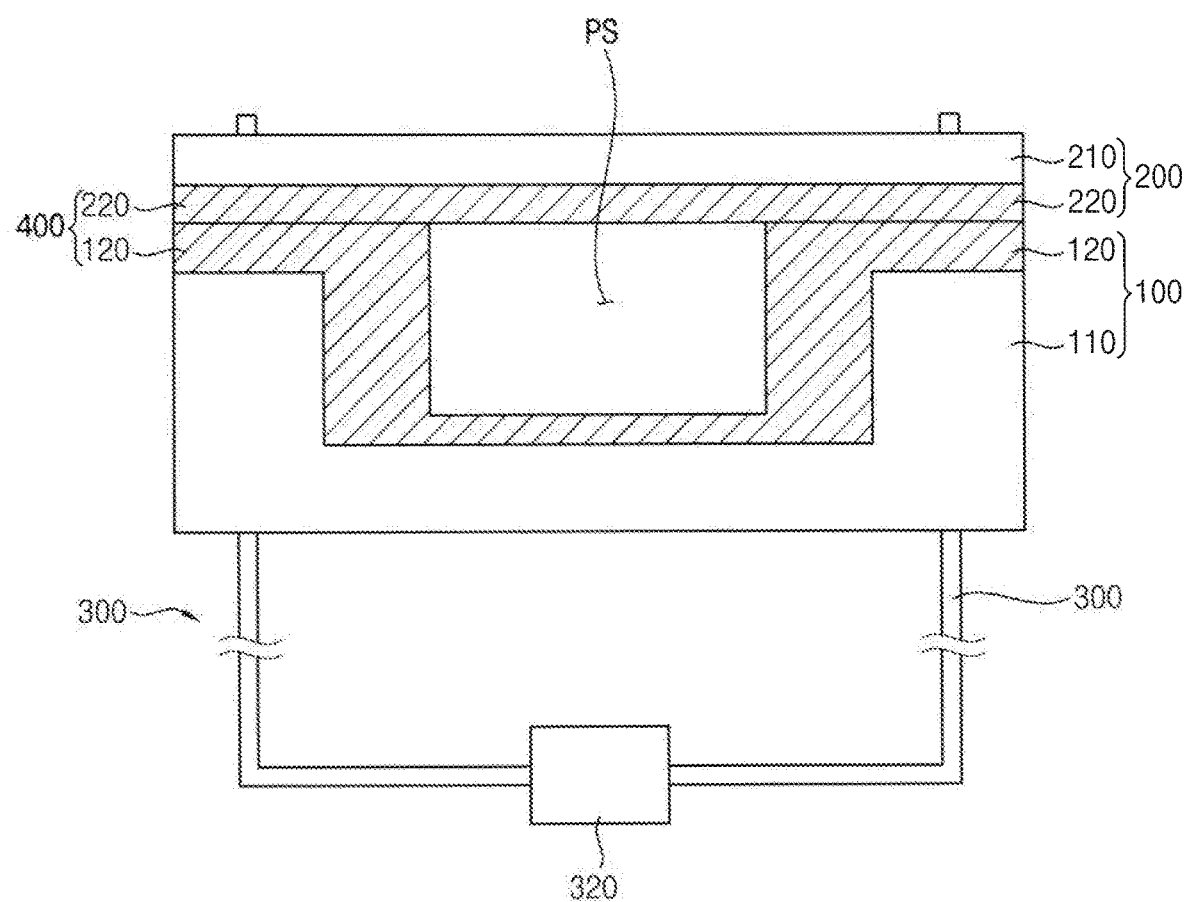
FIG. 1 is a cross-sectional view illustrating a supercritical process chamber in accordance with an example embodiment.

Reference will now be made to example embodiments, which are illustrated in the accompanying drawings, wherein like reference numerals may refer to like components throughout.

Figure 2:
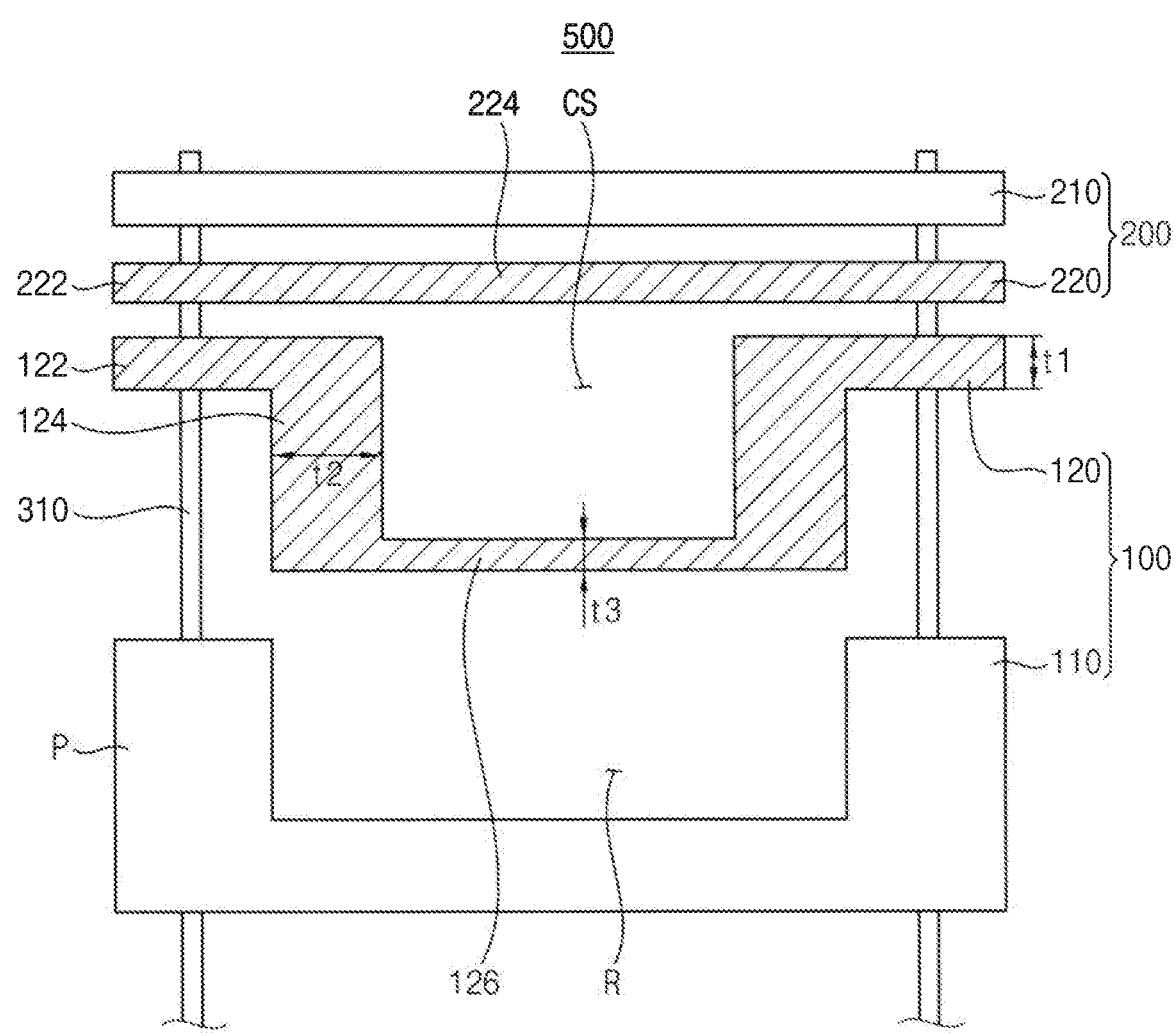
FIG. 2 is an explosive view of the supercritical process chamber shown in FIG. 1.

FIG. 1 is a cross-sectional view illustrating a supercritical process chamber in accordance with an example embodiment, and FIG. 2 is an explosive view of the supercritical process chamber shown in FIG. 1. Hereinafter, a process using a supercritical fluid under supercritical conditions is referred to as supercritical process and a process chamber for the supercritical process is referred to as supercritical process chamber.

Referring to FIGS. 1 and 2, a supercritical process chamber 500 in accordance with an example embodiment may include a body 100 including a body frame 110 and an inner vessel 120 detachably coupled to the body frame 110, a cover 200 including a plate-shaped cover frame 210 and an inner cover 220 detachably coupled to the cover frame 210 and a connector 300 combining the body 100 and the cover 200 such that a supercritical state may be maintained in a process space. According to example embodiments, the connector 300 may be a rod configured to penetrate through the body 100 and the cover 200. It will be understood that when an element is referred to as being "connected" or "coupled" to or "on" another element, it can be directly connected or coupled to or on the other element or intervening elements may be present.

For example, the body 100 may include the body frame 110 and the inner vessel 120. The body frame 110 may have a protrusion P extending upward in a vertical direction toward the cover 200 and a recess R that may be defined by the protrusion P and the inner vessel 120 may be inserted into the recess R. Thus, the recess R may be reduced to a chamber space CS that may be defined by the inner vessel 120.

The body frame 110 may be shaped into a 3-dimensional open solid having sufficient strength and rigidity for the supercritical process using the supercritical fluid. For example, a cylindrical recess R may be provided at a central portion of a hexahedral solid bulk, so that a peripheral portion of the hexahedral solid bulk around the recess R may be provided as the protrusion P. The solid bulk for the body frame 110 may have various shapes as well as the hexahedral shape according to the requirements and environments of the supercritical process chamber 500.

In the present example embodiment, the body frame 110 may comprise stainless steel for resisting the process conditions under a pressure of about 300 bar and a temperature of about 150° C. The body frame 110 and the cover frame 210 may constitute a main body of the supercritical process chamber 500.

The inner vessel 120 may be detachably coupled to the body frame 110 in such a configuration that the inner vessel 120 may be inserted into the recess R and may cover the protrusion P of the body frame 110. Thus, the inner vessel 120 may be shaped into a profile conformal with a surface profile of the protrusion P and the recess R of the body frame 110.

The inner vessel 120 may also have sufficient strength and rigidity for the supercritical process and may make a surface contact with the inner cover 220 for sufficiently sealing off the closed chamber space CS of the inner vessel 120. In the present example embodiment, the inner vessel 120 may comprise steel plated with aluminum (Al) or an aluminum alloy that may be lighter and thus easier for handling than the body frame 110. However, the inner vessel 120 may comprise various materials as long as the strength and rigidity of the inner vessel 120 is sufficient for the supercritical process and the inner vessel 120 makes a sufficiently tight surface contact with the inner cover 220 for sealing off the closed chamber space CS.

For example, the inner vessel 120 may include a body contact 122 that may be positioned on the protrusion P of the body frame 110 and may have a first thickness t1 in a direction perpendicular (vertical direction) to the uppermost surface of the body frame 110, a size controller 124 that may be positioned on a sidewall of the recess R of the body frame 110 and may have a second thickness t2 in a direction parallel (horizontal direction) to the uppermost surface of the body frame 110 and a vessel bottom 126 that may be positioned on a bottom of the body frame 110 and may have a third thickness t3 in the direction perpendicular (vertical direction) to the uppermost surface of the body frame 110. The recess R may be reduced into the chamber space CS by the size controller 124, so that the size of the chamber space CS may be controlled by the configurations of the size controller 124. According to example embodiments, the second thickness t2 may be greater than both the first thickness t1 and the third thickness t3 and the third thickness t3 may be smaller than the first thickness t1.

The body contact 122 may be positioned on the protrusion P and may make a surface contact with a cover contact 222 of the inner cover 220, which will be described in detail hereinafter, by an external force for combining the body 100 and the cover 200. For example, the body 100 and the cover 200 may be compressed by a compressive force between the body contact 122 and the cover contact 222 and the closed chamber space CS may be transformed to a process space PS in which the supercritical process may be performed by using the supercritical fluid under the supercritical state. According to example embodiments, when the body 100 and the cover 200 are in a compressed state, the uppermost surface of the protrusion P is in contact with the lowermost surface of the body contact 122, inner sidewall of the protrusion P is in contact with the outer sidewall of the size controller 124, the uppermost surface of the body contact 122 is in contact with the lowermost surface of the inner cover 220, and the uppermost surface of the inner cover 220 is in contact with the lowermost surface of the cover frame 210. When an element is referred to as "contacting" or "in contact with" another element, there are no intervening elements present.

The body contact 122 may have such a sufficient thickness that the compressive force may be sufficiently applied to the body 100 and the cover 200 for maintaining the supercritical state in the process space PS. Thus, the first thickness t1 of the body contact 122 may be determined in view of the fluid leakage of the process space PS.

When the first thickness of the body contact 122 may be excessively large, the supercritical process chamber 500 may be so high that the apparatus having the supercritical process chamber 500 may require very large installation occupancy. In contrast, when the first thickness t1 of the body contact 122 may be excessively small, the body 100 and the cover 200 may be broken by the compressive force. Accordingly, the first thickness t1 of the body contact 122 may be varied in accordance with the compressive force between the body 100 and the cover 200 and the supercritical conditions in the process space PS.

The size controller 124 and the vessel bottom 126 may be inserted into the recess R, so that the size of the recess R may be reduced by the size controller 124 and the vessel bottom 126, thereby providing the chamber space CS in the recess R.

Particularly, since some fluid lines (not shown) through which the supercritical fluid may flow may be connected into the process space PS through the vessel bottom 126, the vessel bottom 126 may need to be as thin as possible. Thus, the size of the chamber space CS may be mainly determined by the configurations of the size controller 124.

In the present example embodiment, the size of the chamber space CS may be varied by the second thickness t2 and the shape of the size controller 124. Particularly, the shape of the chamber space CS may be varied just by changing the shape of the size controller 124 regardless of the shape of the recess R.

When the body 100 and the cover 200 may be coupled to each other by the connector 300, the chamber space CS may be closed and isolated from surroundings and may be transformed to the process space PS. Thus, the shape of the process space PS may be largely determined by the shape of the chamber space CS and the shape and size of the size controller 124 may be determined by the configurations of the process space PS.

FIGS. 3A to 3D are plan view illustrating the chamber space of the process chamber shown in FIG. 1.

Figure 3A:
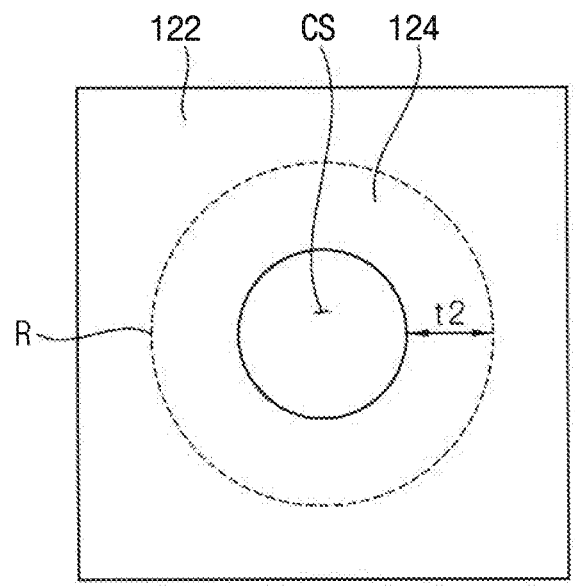
FIGS. 3A to 3D are plan view illustrating the chamber space of the process chamber shown in FIG. 1.

When the second thickness t2 of the size controller 124 may be uniform along the circumference of the recess R, the chamber space CS may have the same shape of the recess R, except that the size of the chamber space CS may be smaller than that of the recess R, as illustrated in FIG. 3A.

Figure 3B:
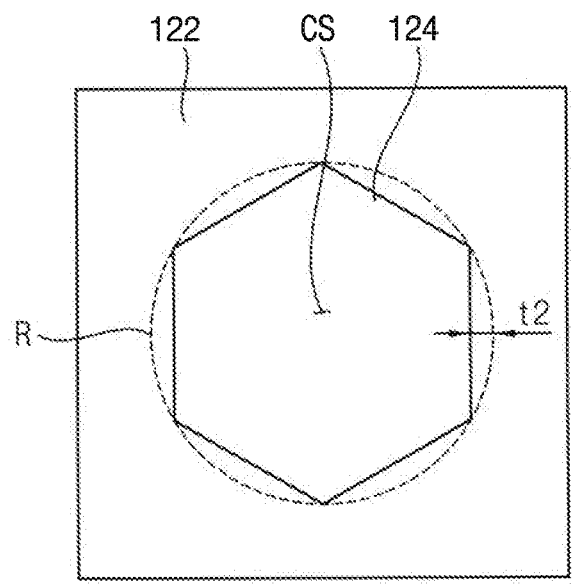
Figure 3C:
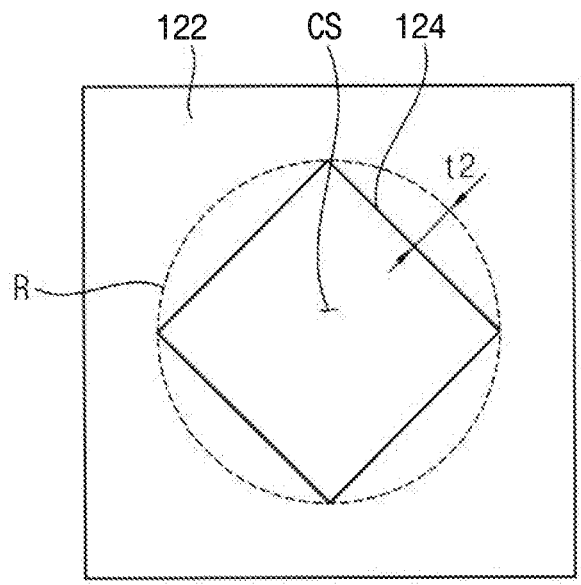
Figure 3D:
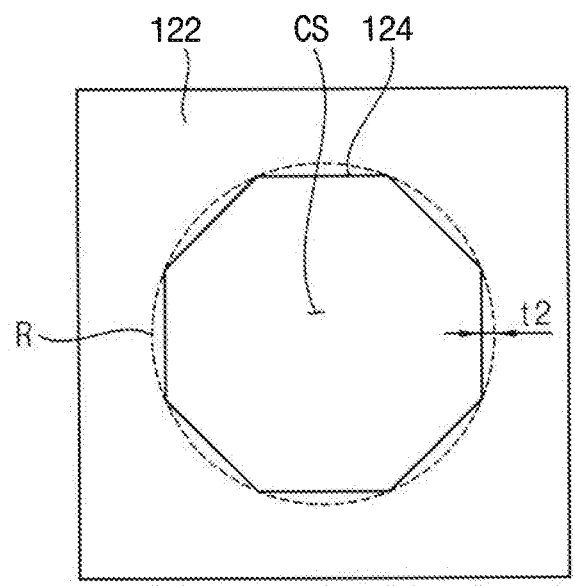

In contrast, the second thickness t2 of the size controller 124 may be non-uniform along at least one of depth and a circumference of the recess R, the chamber space CS may have various shapes regardless of shape of the recess R and the size of the chamber space CS may be smaller than that of the recess R. For example, the size controller 124 may be shaped into one of rectangular, hexagonal and octagonal surfaces in a plan view point, as illustrated in FIGS. 3B to 3C, so that the chamber space CS may be shaped into a rectangular cylinder, a hexagonal cylinder or an octagonal cylinder regardless of the shape of the recess R.

Accordingly, the shape of the process space PS of the supercritical process chamber 500 may be easily changed without exchanging the main body of the supercritical process chamber 500 just by changing the shape of the inner vessel 120. Thus, the process space PS of the supercritical process chamber 500 may be easily and simply optimized in view of the characteristics of the supercritical process and a substrate to which the supercritical process may be performed. For example, the process space PS may be individually customized in view point of the supercritical process and the substrate just by exchanging the inner vessel 120.

In addition, the inner vessel 120 may be modified for an individual supercritical process or an individual apparatus to which the supercritical process chamber 500 may be installed just by changing the configurations of the body contact 122, the size controller 124 and the vessel bottom 126.

Figure 4A:
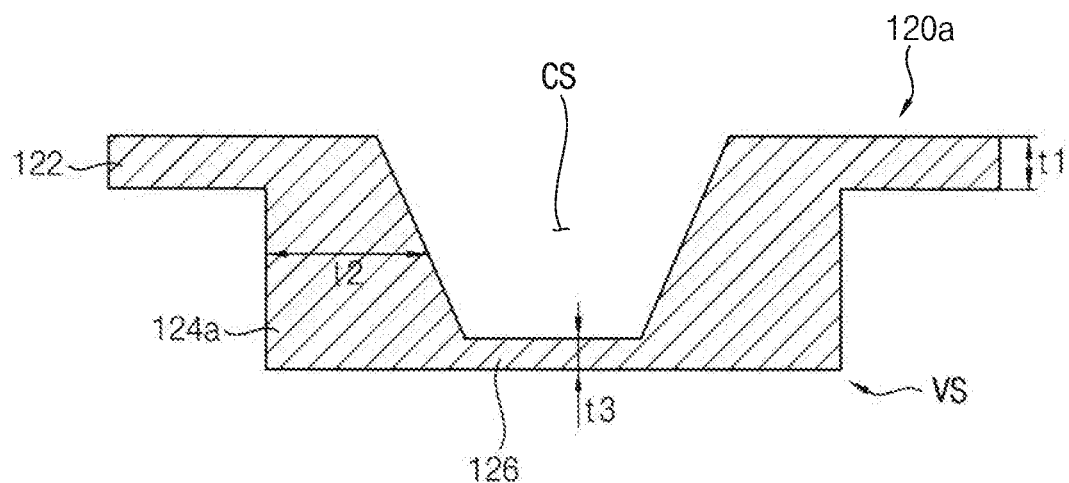
FIG. 4A is a cross-sectional view illustrating a first modification of the inner vessel shown in FIG. 1.
Figure 4B:
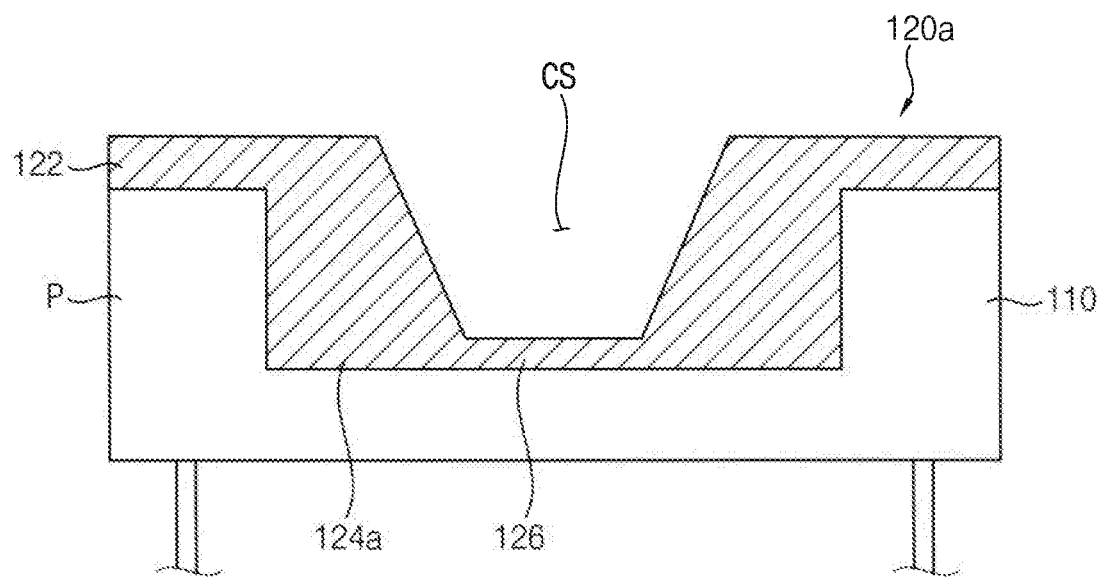
FIG. 4B is a cross-sectional view illustrating the combination of the first modified inner vessel shown in FIG. 4A and the body frame shown FIG. 1.

FIG. 4A is a cross-sectional view illustrating a first modification of the inner vessel shown in FIG. 1, and FIG. 4B is a cross-sectional view illustrating the combination of the first modified inner vessel shown in FIG. 4A and the body frame shown FIG. 1.

Referring to FIGS. 4A and 4B, a first modified inner vessel 120a may include a modified size controller 124a of which the inner sidewall may be slanted along the depth of the recess R, so that the chamber space CS may be tapered along the depth of the recess R. For example, the second thickness t2 of the modified size controller 124a in a direction parallel (horizontal direction) to the uppermost surface of the body frame 110 may increase along the depth of the recess R and an upper size of the chamber space CS may be greater than a lower size of the chamber space CS.

Therefore, the size of the chamber space CS may be non-uniform along the depth of the recess R in the first modified inner vessel 120a, while the size of the chamber space CS may be uniform along the depth of the recess R in the inner vessel 120 (e.g., as illustrated in FIG. 2).

Although not illustrated in figures, the second thickness t2 of the modified size controller 124a in a direction parallel (horizontal direction) to the uppermost surface of the body frame 110 may decrease along the depth of the recess R in the first modified inner vessel 120a, so an upper size of the chamber space CS may be smaller than a lower size of the chamber space CS.

In an example embodiment, the body contact 122, the size controller 124 and the vessel bottom 126 of the inner vessel 120 may be integrally provided into a single body, so that a single vessel may be provided as the inner vessel 120 and the body frame 110 may be covered by the single vessel along a surface profile of the protrusion P and the recess R.

Therefore, when the single vessel may be inserted into the recess R, the protrusion P may be covered by the single vessel and the size of the recess R may be reduced as much as the second thickness t2 of the size controller 124 and the third thickness t3 of the vessel bottom 126, thereby providing the chamber space CS in the recess R of the body frame 110. For example, only the combination of the body frame 110 and the inner vessel 120 may provide various chamber spaces CS in the body 100.

Figure 5A:
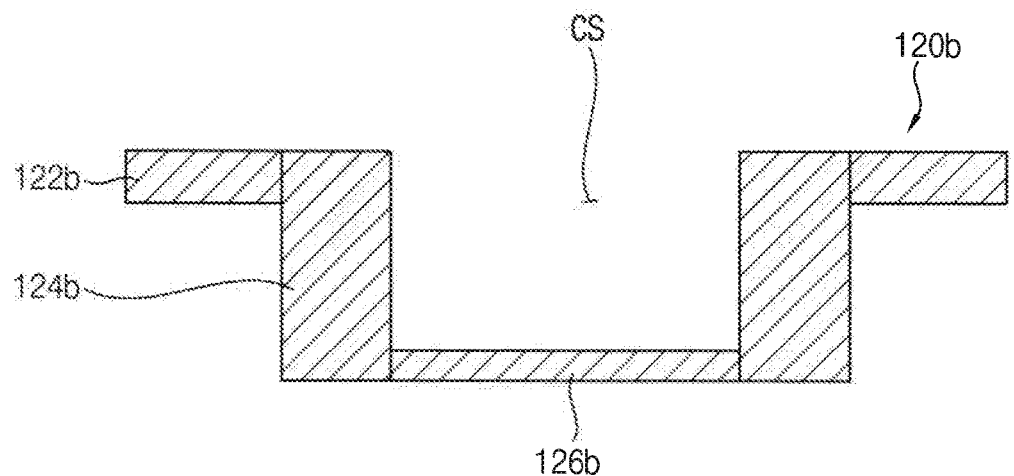
FIG. 5A is a cross-sectional view illustrating a second modification of the inner vessel shown in FIG. 1 according to an example embodiment of the present inventive concept.
Figure 5B:
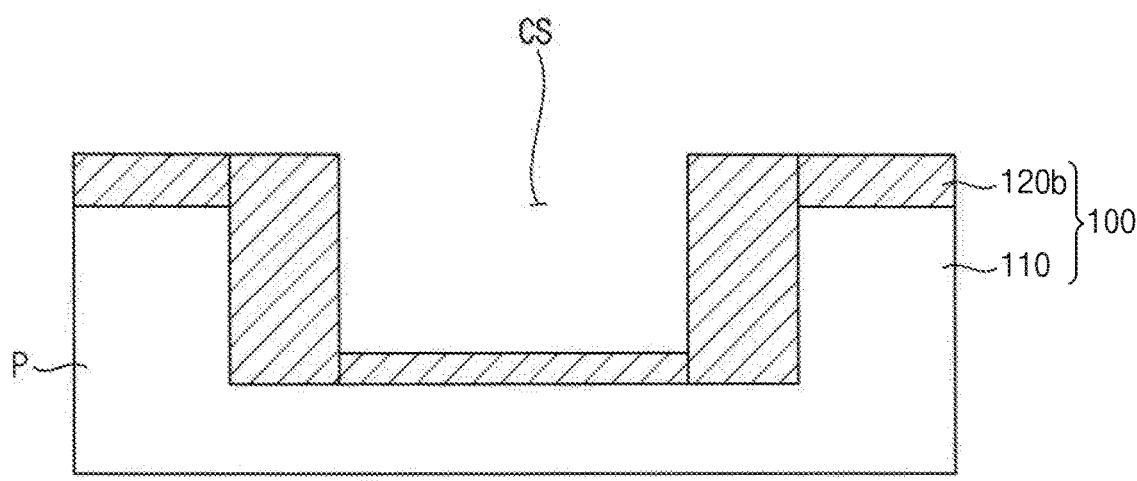
FIG. 5B is a cross-sectional view illustrating the combination of the second modified inner vessel shown in FIG. 5A and the body frame shown FIG. 1.
Figure 5C:
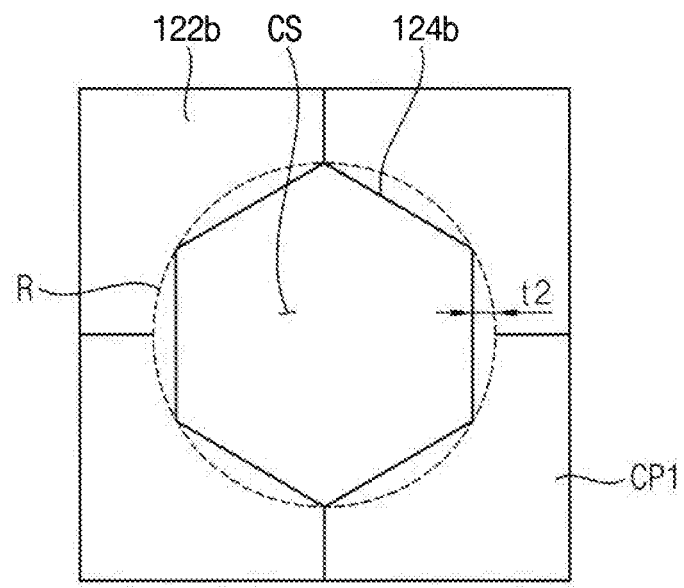
FIG. 5C is a plan view illustrating the chamber space of the combination of the second modified inner vessel and the body frame.
Figure 5D:
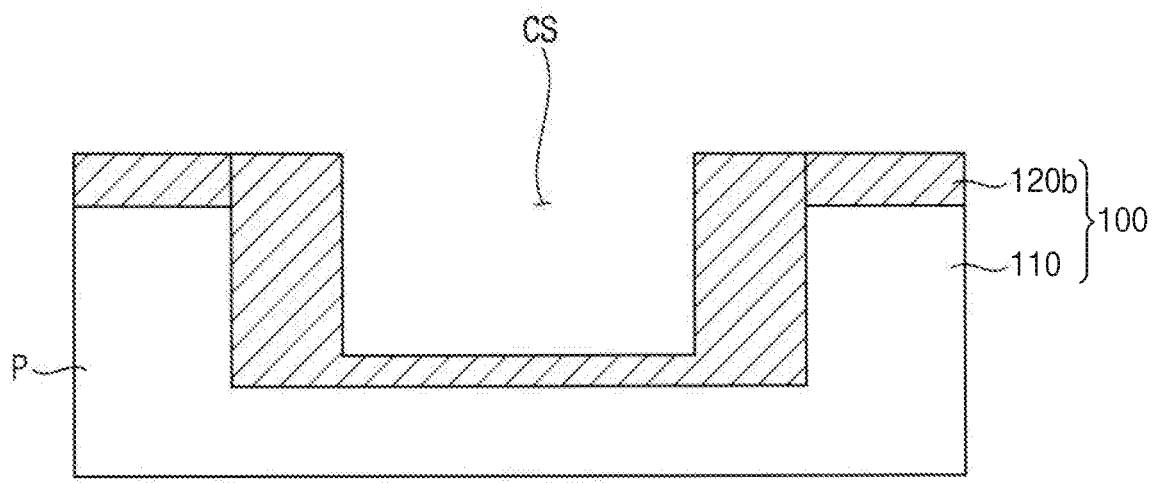
FIG. 5D is a cross-sectional view illustrating another example embodiment of the second modification of the inner vessel shown in FIG. 5A.

FIG. 5A is a cross-sectional view illustrating a second modification of the inner vessel shown in FIG. 1 according to an example embodiment of the present inventive concept, and FIG. 5B is a cross-sectional view illustrating the combination of the second modified inner vessel shown in FIG. 5A and the body frame shown FIG. 1. FIG. 5C is a plan view illustrating the chamber space of the combination of the second modified inner vessel and the body frame. FIG. 5D is a cross-sectional view illustrating another example embodiment of the second modification of the inner vessel shown in FIG. 5A.

Referring to FIGS. 5A to 5D, a second modified inner vessel 120b may include the body contact 122b, the size controller 124b and the vessel bottom 126b that may be individually separated from one another.

Thus, the body contact 122b, the size controller 124b and the vessel bottom 126b may be individually assembled with the protrusion P, the sidewall of the recess R and the bottom of the recess R, respectively, thereby providing the second modified inner vessel 120b along a surface profile of the protrusion P and the recess R of the body frame 110. Therefore, the assemble efficiency and facility between the body frame 110 and the second modified inner vessel 120b may be improved as compared between the body frame 110 and the inner vessel 120.

Various structures such as the fluid lines through which the supercritical fluid may flow may be provided in the chamber space CS, so the individual assembly between the body frame 110 and the second modified inner vessel 120b may facilitate the installation of the structures inside the chamber space CS. Accordingly, the individual assemble of the body frame 110 and the second modified inner vessel 120b may increase the installation efficiency of the apparatus having the supercritical process chamber 500.

Particularly, since the body contact 122b may be individually arranged on the protrusion P of the body frame 110 apart from the size controller 124b, the body contact 122b may function as a first contact piece CP1 (i.e., a body contact piece) that may be locally exchanged according to the individual and local failures, as shown in FIG. 5C.

For example, the connector 300 may penetrate through the body 100 and the cover 200 and may pressurize the body 100 and the cover 200 to each other and the body contact 122b may be interposed between the body frame 110 and the cover 200. Thus, the compressive force for combining the body 100 and the cover 200 may be applied to the body contact 122b and may be locally damaged or broken according to the distribution of the compressive force. When the body contact 122b may be separated by a unit of the connector 300 as the first contact piece CP1, the body contact 122b may be locally and individually exchanged or impaired according to its own damage or failure that may be caused by the respective compressive force. Accordingly, when the contact area between the body 100 and cover 200 may be locally damaged or broken, only the first contact piece CP1 may be exchanged or impaired without exchanging the size controller 124b and the vessel bottom 126b in the recess R of the body frame 110, thereby significantly reducing the maintenance cost of the supercritical process chamber 500.

The size controller 124b may be shaped into a hexagon in a plan view in FIG. 5C. However, the hexagonal shape of the size controller 124b is illustrative of example embodiments and is not to be construed as the shape limits of the size controller 124b. The size controller 124b may have various shapes such as the shapes illustrated in FIGS. 3A, 3C and 3D and may have slant sidewall as illustrated in FIGS. 4A and 4B.

While the body contact 122b, the size controller 124b and the vessel bottom 126b of the second modified inner vessel 120b may be separated from one another and may be individually assembled with the body frame 110, the size controller 124b and the vessel bottom 126b may be provided as a single vessel that may be buried in the recess R and the body contact 122b may be individually arranged on the protrusion P apart from the size controller 124b as the first contact piece CP1, as illustrated in FIG. 5D.

Referring again to FIGS. 1 and 2, the cover frame 210 may include a single plate having sufficient strength and rigidity for the supercritical process and may constitute the main body of the supercritical process chamber 500 together with the body frame 110. For example, the cover frame 210 may comprise stainless steel just like the body frame 110.

The inner cover 220 may be detachably coupled to the cover frame 210 in such a configuration that a front surface of the cover frame 210, which may face the recess R of the body frame 110, may be covered with the inner cover 220. For example, a fixing bump (not shown) may be arranged on the front surface of the cover frame 210 and the inner cover 220 may be detachably fixed to the fixing bump and may be coupled to the cover frame 210. In the present example embodiment, the inner cover 220 may also be shaped into a plate that may sufficiently cover the front surface of the plate-shaped cover frame 210.

For example, the inner cover 220 may include a cover contact 222 making a surface contact with the body contact 122 and the size controller 124 of the inner vessel 120 and a ceiling 224 facing the vessel bottom 126 and closing the chamber space CS from surroundings.

The cover contact 222 and the ceiling 224 may be integrally provided into a single plate that may have a uniform thickness across the body 100 and may cover the front surface of the cover frame 210.

The inner cover 220 may comprise the same material composition as the inner vessel 120 and the cover contact 222 may make a surface contact with the body contact 122 and the size controller 124 when the body 100 and the cover 200 may be coupled to each other.

When the compressive force may be applied to the body 100 and cover 200 in such a way that the supercritical state may be maintained in the process space PS of the supercritical process chamber 500, the inner vessel 120 and the inner cover 220 may be contact with each other instead of the body frame 110 and the cover frame 210 and thus the surface grinding or erosion may be sufficiently prevented at the contact portion of the body 100 and the cover 200.

In addition, when the surface roughness of the inner cover 220 and the inner vessel 120 may increase at the contact area due to the direct contact therebetween, the inner cover 220 and the inner vessel 120 may be separated from the cover frame 210 and the body frame 110, respectively, and may be easily exchanged by new ones without any changes of the body frame 110 and the cover frame 210 of the supercritical process chamber 500. Thus, the increase of the surface roughness at the contact area of the body 100 and cover 200 and the fluid leakage caused by the contact deterioration at the contact area may be easily prevented just by exchange of the inner vessel 120 and the inner cover 220.

The inner cover 220 may have a sufficient thickness for the compressive force together with the body contact 122, so that the compressive force may be sufficiently applied to the body 100 and the cover 200 without any failures of the inner cover 220 and the inner vessel 120.

The inner cover 220 may have various configurations according to the supercritical process and the substrate to which the supercritical process may be performed like the inner vessel 120.

Figure 6A:
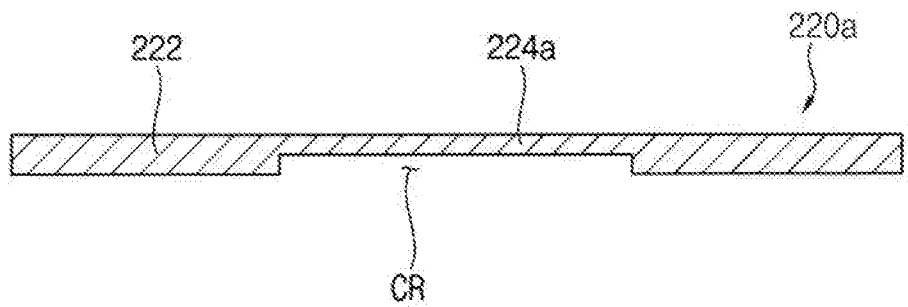
FIG. 6A is a cross-sectional view illustrating a first modification of the inner cover shown in FIG. 1.
Figure 6B:
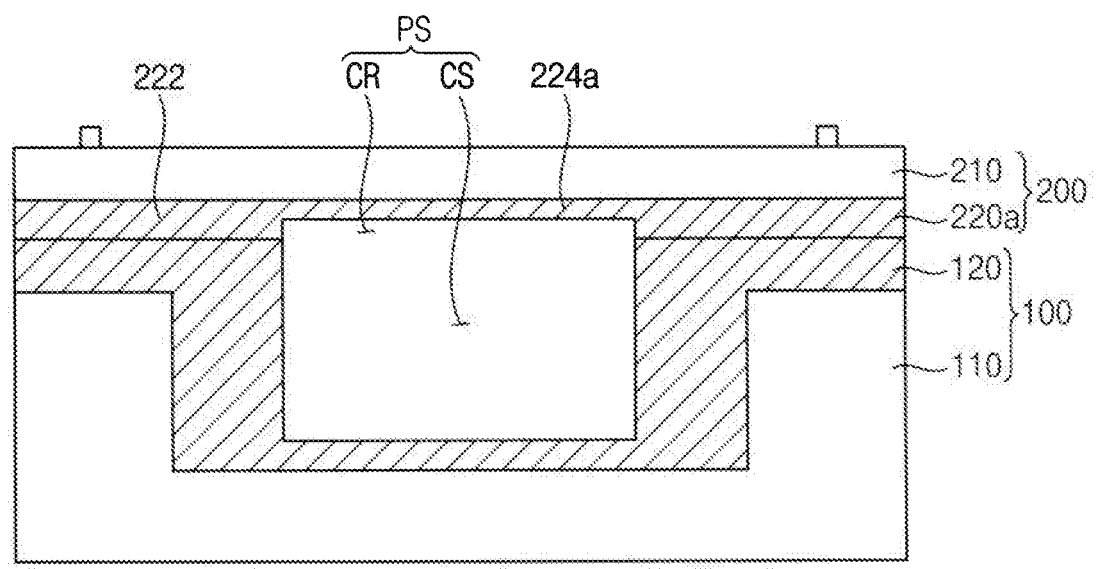
FIG. 6B is a cross-sectional view illustrating the combination the body shown in FIG. 1 and the cover having the first modified inner cover shown in FIG. 6A.

FIG. 6A is a cross-sectional view illustrating a first modification of the inner cover shown in FIG. 1, and FIG. 6B is a cross-sectional view illustrating the combination the body shown in FIG. 1 and the cover having the first modified inner cover shown in FIG. 6A.

Referring to FIGS. 6A and 6B, a first modified inner cover 220a may include the cover contact 222 and a reduced ceiling 224a having a thickness smaller than that of the cover contact 222. Thus, the first modified cover 220a may include a ceiling recess CR that may be defined by the cover contact 222. The cover contact 222 and the reduced ceiling 224a may be integrally provided into a single plate and the first modified inner cover 220a may be coupled to the cover frame 210 in such a configuration that the front surface of the cover frame 210 may be covered with the first modified inner cover 220a.

When the cover 200 having the first modified inner cover 220a may be coupled with the body 100, the ceiling recess CR may be communicated with the chamber space CS of the inner vessel 120 thus the process space PS may expand to the ceiling recess CR from the chamber space CS. Therefore, the space margin for the supercritical process may increase in the supercritical process chamber 500.

Figure 7A:
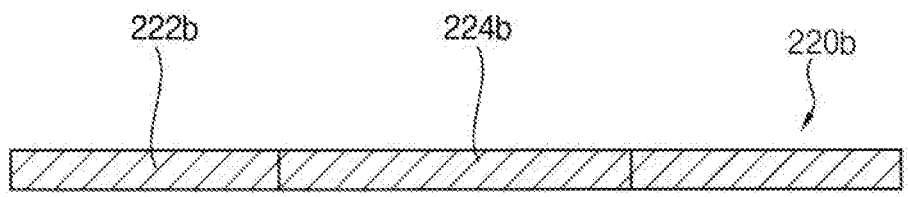
FIG. 7A is a cross-sectional view illustrating a second modification of the inner cover shown in FIG. 1.
Figure 7B:
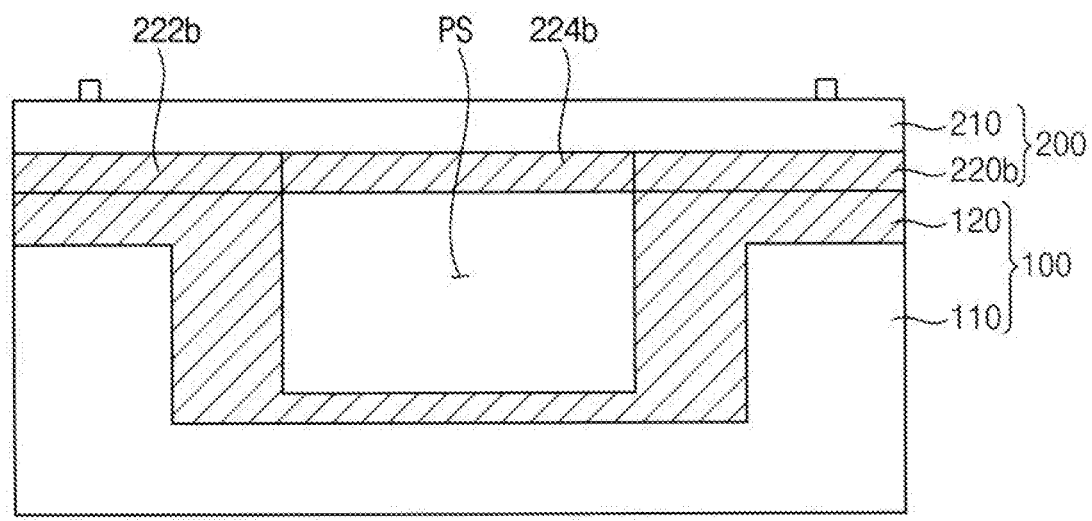
FIG. 7B is a cross-sectional view illustrating the combination the body shown in FIG. 1 and the cover having the second modified inner cover shown in FIG. 7A.
Figure 7C:
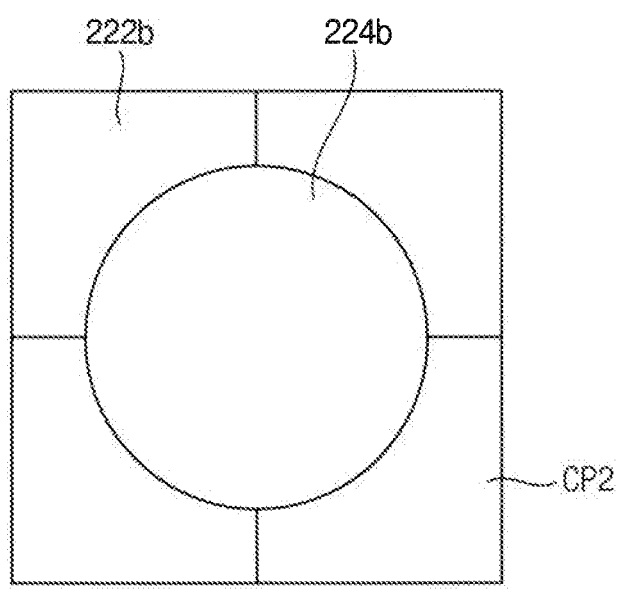
FIG. 7C is a plan view of the second modified inner cover shown in FIG. 7A.

FIG. 7A is a cross-sectional view illustrating a second modification of the inner cover shown in FIG. 1, and FIG. 7B is a cross-sectional view illustrating the combination the body shown in FIG. 1 and the cover having the second modified inner cover shown in FIG. 7A. FIG. 7C is a plan view of the second modified inner cover shown in FIG. 7A.

Referring to FIGS. 7A to 7C, the second modified inner cover 220b may include the cover contact 222b and the ceiling 224b that may be individually separated from one another.

Thus, the cover contact 222b and the ceiling 224b may be individually assembled with the cover frame 210, thereby providing the cover 200 in which the cover frame 210 may be covered with the second modified inner cover 220*b*. Therefore, the assemble efficiency and facility between the cover frame 210 and the second modified inner cover 220*b* may be improved as compared between the cover frame 210 and the inner cover 220.

Since various structures such as the fluid lines may be provided in the chamber space CS as described above, the individual assembly between the cover frame 210 and the second modified inner cover 220*b* may facilitate the installation of the structures inside the chamber space CS. Accordingly, the individual assemble of the cover frame 210 and the second modified inner cover 220*b* may increase the installation efficiency of the apparatus having the supercritical process chamber 500.

Particularly, since the cover contact 222*b* may be individually arranged on the body contact 122 and the size controller 124 of the inner vessel 120 apart from the ceiling 224*b*, the cover contact 222*b* may function as a second contact piece CP2 (i.e., a cover contact piece) that may be locally exchanged according to the individual and local failures thereof, as shown in FIG. 7C.

For example, the connector 300 may penetrate through the body 100 and the cover 200 and may pressurize the body 100 and the cover 200 to each other, and the cover contact 222*b* may be interposed between the body 100 and the cover frame 210. Thus, the compressive force for combining the body 100 and the cover 200 may be applied to the cover contact 222*b* and may be locally damaged or broken according to the distribution of the compressive force. When the cover contact 222*b* may be separated by a unit of the connector 300 as the second contact piece CP2, the cover contact 222*b* may be locally and individually exchanged or impaired according to its own damage or failure that may be caused by the respective compressive force. Accordingly, when the contact area between the body 100 and cover 200 may be locally damaged or broken, only the second contact piece CP2 may be exchanged or impaired without exchanging the ceiling 224*b*, thereby reducing the maintenance cost of the supercritical process chamber 500.

Referring to FIGS. 1 and 2, the connector 300 may drive at least one of the body 100 and the cover 200 to move upwards or downwards and may attach the body 100 and the cover 200 to each other by the compressive force.

For example, the connector 300 may include a lifter 310 connected with the body 100 and cover 200 through the protrusion P of the body frame 110 and lifting at least one of the body 100 and the cover 200 and a power 320 for operating the lifter 310.

In the present example embodiment, the cover 200 may remain stationary and the body 100 may move upwards and attach with the cover 200 or may move downwards and be separated from the cover 200 by the lifter 310.

The connector 300 may apply a sufficient compressive force to the body 100 and the cover at the contact area thereof by using a hydraulic system so as to generate the supercritical state in the process space PS of the supercritical process chamber 500. For example, the process space PS may be under a pressure of about 300 bar to about 500 bar by the connector 300.

According to the supercritical process chamber 500, the process chamber may include the body 100 having the body frame 110 and the inner vessel 120 and the cover 200 having the cover frame 210 and the inner cover 220. The inner cover 220 may be detachably coupled to the cover frame 210 and the inner vessel 120 may be detachably coupled to the body frame 110. The body 100 and the cover 200 may be coupled into the supercritical process chamber 500 by the compressive force in such a configuration that the inner vessel 120 may make contact with the inner cover 220 without direct contact between the body frame 110 and the cover frame 210.

Thus, when the contact surface of the inner vessel 120 and the inner cover 220 may be grinded and damaged by the compressive force and thus the contaminant particles may be generated from the contact area together with the increase of the surface roughness, the inner vessel 120 and the inner cover 220 may be exchanged with new ones without exchanging the body frame 110 and the cover frame 210 and the damage or defect such as the high surface roughness of the contact area of the body 100 and cover 200 may be removed while the main body of the supercritical process chamber 500 may still remain unchanged. Therefore, the process defects and failures of the supercritical process caused by the damage or defect of the contact area may be prevented in the supercritical process chamber 500.

Particularly, when the body contact 122 may be individually arranged on the body frame 110 apart from the size controller 124 as the body contact piece and the cover contact 222 may be individually arranged on the cover frame 210 apart from the cover frame 210 as the cover contact piece, the body contact 122 and the cover contact 222 may be locally exchanged instead of the whole of the body contact 122 and the cover contact 222 according to the individual and local failures thereof. Accordingly, the maintenance cost of the supercritical process chamber 500 may be significantly reduced and the exchange facility of the inner vessel 120 and the inner cover 220 may be improved by the body contact piece and the cover contact piece.

According to example embodiments, the inner vessel 120 and the inner cover 220 may integrally form a buffer chamber 400 (e.g., as illustrated in FIG. 1) that may be detachably coupled to an inside of the supercritical process chamber 500 and may define the process space PS of the supercritical process chamber 500 in such a way that the direct contact of the body frame 110 and the cover frame 210 is replaced by the direct contact of the inner vessel 120 and the inner cover 220 of the buffer chamber 400. Therefore, when the surface roughness of the contact surfaces of the buffer chamber 400 is deteriorated, the buffer chamber 400 is exchanged with new ones without exchanging the body frame 110 and the cover frame 210 of the supercritical process chamber 500. For example, the inner vessel 120 of the buffer chamber 400 may be detachably coupled to the body frame 110 of the supercritical process chamber 500 and the inner cover 220 of the buffer chamber 400 may be detachably coupled to the cover frame 210 of the supercritical process chamber 500. Thus, when the surface roughness therein is deteriorated, the inner vessel 120 and the inner cover 220 may be separated from the body frame 110 and the cover frame 210, respectively, and are exchanged with new ones thereto.

Particularly, when the contact portions of the inner vessel 120 and the inner cover 220 are composed of individual contact pieces (e.g., CP1 as illustrated in FIG. 5C or CP2 as illustrated in FIG. 7C), the exchange of the inner vessel 120 and the inner cover 220 may be replaced with the exchange of the contact pieces only, thereby improving the facility and efficiency of the buffer chamber 400 exchange.

Figure 8:
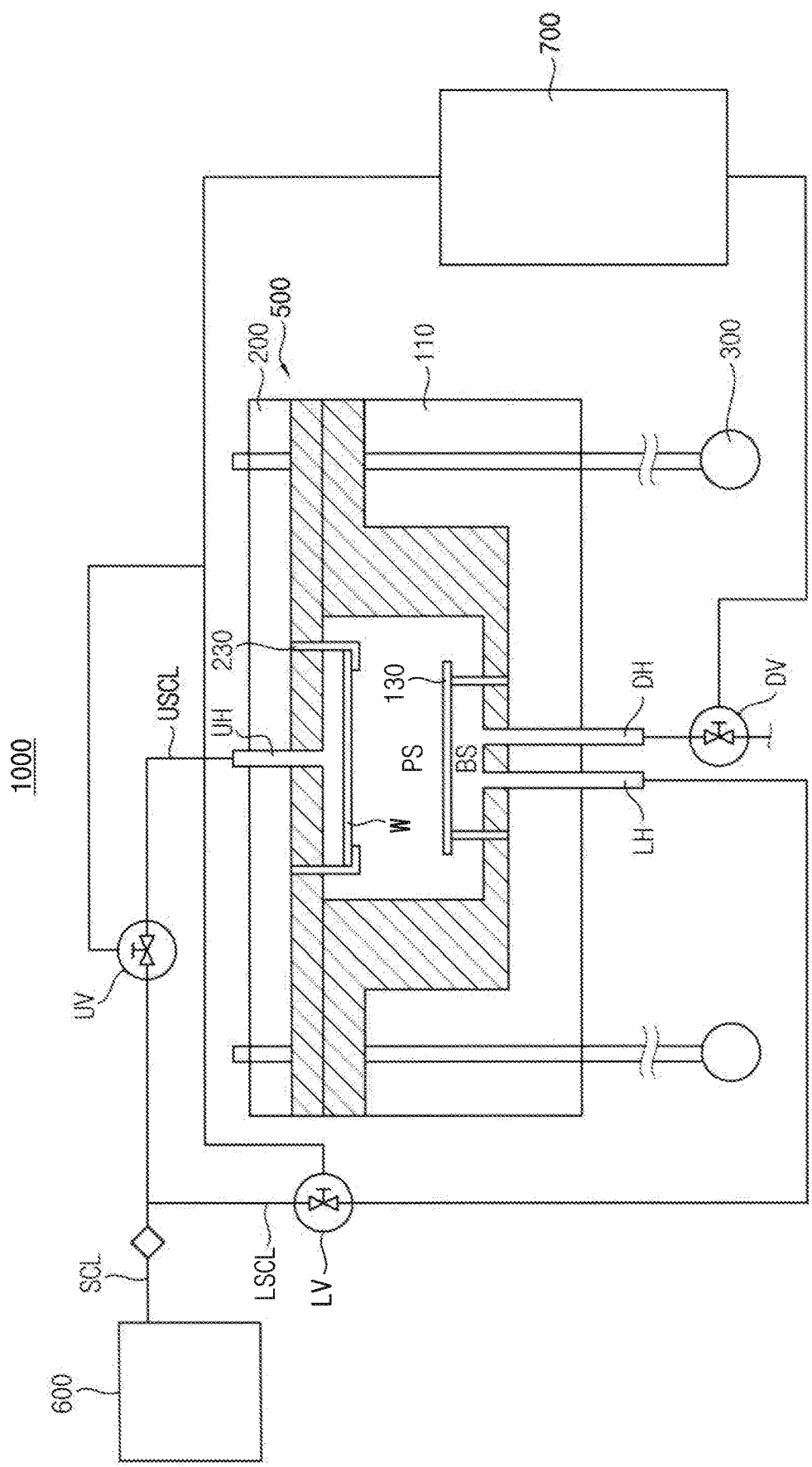
FIG. 8 is a structural view illustrating an apparatus for treating substrates having the supercritical process chamber shown in FIG. 1.

FIG. 8 is a structural view illustrating an apparatus for treating substrates having the supercritical process chamber shown in FIG. 1.

Referring to FIG. 8, an apparatus 1000 for treating substrates in accordance with an example embodiment of the present inventive concept may include a supercritical process chamber 500 having a process space PS in which the substrate W may be processed by using a supercritical fluid, a supply module 600 supplying the supercritical fluid into the process space PS from an exterior of the supercritical process chamber 500 and a process controller 700 connected to the supercritical process chamber 500 and the supply module 600 and controlling a flow of the supercritical fluid according to process conditions in the process space PS.

For example, the supercritical process chamber 500 may include a body 100 having a buffer space BS and to which a blocking plate 130 may be secured, a cover 200 that may be coupled with an upper portion of the body 100 and have a substrate holder 230 for holding the substrate W in the supercritical process and a connector 300 for combining the body 100 and the cover 200 by a compressive force. A process space PS may be provided in the supercritical process chamber 500 and the supercritical process may be performed to the substrate W in the process space PS.

The supercritical process chamber 500 may have substantially the same structures as the supercritical process chamber as described in detail with references to FIGS. 1 to 7C. In FIG. 8, the same reference numerals denote the same elements of FIGS. 1 to 7C and any further detailed descriptions on the same elements will be omitted hereinafter.

Thus, the body 100 may include a body frame 110 having a protrusion P and a recess R and an inner vessel 120 detachably coupled to the body frame 110 such that the inner vessel 120 may be inserted into the recess R and may cover the protrusion P. The cover 200 may include a plate-shaped cover frame 210 and an inner cover 220 detachably coupled to the plate-shaped cover frame 210 such that the inner cover 220 may make a surface contact with the inner vessel 120.

The body 100 may move upwards and be coupled to the cover 200 by the connector 300 in such a configuration that the body contact 122 and the size controller 124 of the inner vessel 120 may make a surface contact with the cover contact 222 of the inner cover 220 and the process space PS may be defined by the ceiling 224 of the inner cover 220 and the size controller 124 and the vessel bottom 126. Therefore, the size and shape of the process space PS may be determined by the size controller 124 and the ceiling 224.

The blocking plate 130 may be positioned above the vessel bottom 126 and the buffer space BS may be provided between the blocking plate 130 and the vessel bottom 126. Thus, the size and shape of the buffer space BS may be determined by the vessel bottom 126 and the blocking plate 130.

In an example embodiment, a lower hole LH and a discharge hole DH may be arranged through the vessel bottom 126 and the body frame 110 in such a way that the buffer space BS may communicate with the supply module 600. The supercritical fluid may be supplied to the supercritical process chamber 500 through lower hole LH and the residuals of the supercritical fluid and the byproducts of the supercritical fluid may be discharged from the supercritical process chamber 500 through the discharge hole DH.

When the supercritical fluid may be directly injected onto the substrate W in the supercritical process chamber 500, the substrate W may be damaged due to the high pressure of the supercritical fluid. Thus, the blocking plate 130 may be positioned between the substrate W and the lower hole LH, so the supercritical fluid may be sufficiently prevented from the direct injection to the substrate W by the blocking plate 130. The flow path of the supercritical fluid may be changed to a side portion of the blocking plate 130 and the supercritical fluid may be supplied into the process space PS without direct injection to the substrate W.

The cover 200 may remain stationary at a predetermined position and the substrate holder 230 may move downwards from the cover frame 210 or may move upwards to the cover frame 210. The substrate W may be secured to a horizontal bar and the horizontal bar may be secured to a vertical rod that may be movably secured to the cover frame 210 through the inner cover 220.

An upper hole US may be arranged through the cover frame 210 and the inner cover 220 and may be connected to an upper supercritical line USCL.

Although not illustrated in figures, a plurality of heaters (not shown) may be further provided in the body 100 and the cover 200 for heating the body 100 and the cover 200.

The supercritical process may include various unit processes for manufacturing semiconductor devices and the substrate W may include a silicon substrate such as a silicon wafer. For example, the supercritical process may include a cleaning process and a rinsing process in which the substrate W having undergone an etching process may be cleaned or rinsed by using the supercritical fluid. In addition, the supercritical process may include a dry process in which a cleaning solution or a rinsing solution may be dried off from the substrate W by using the supercritical fluid after completing the cleaning process and the rinsing process to the substrate W. Thus, the compositions of the supercritical fluid may be varied according to the supercritical process.

Figure 9:
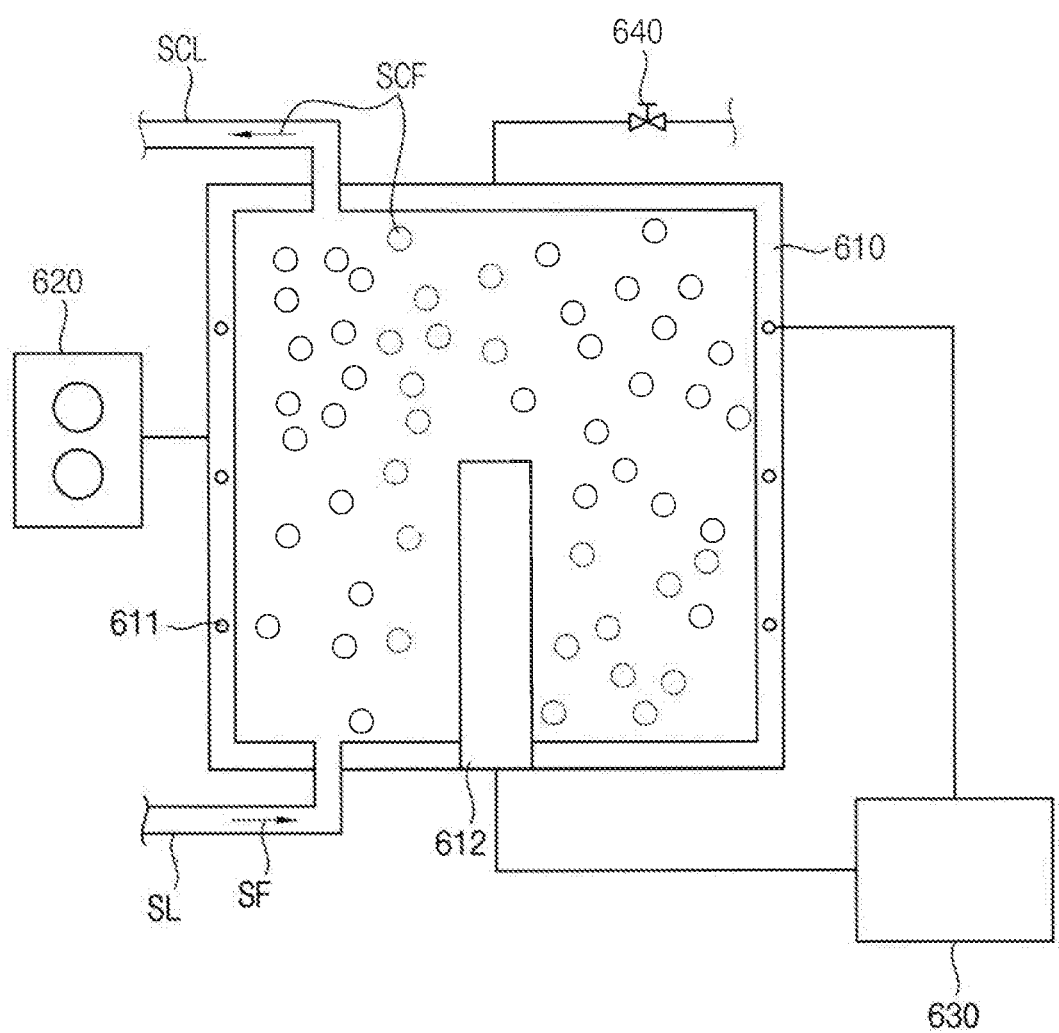
FIG. 9 is a structural view illustrating the supply module of the apparatus shown in FIG. 8 in accordance with an example embodiment of the present inventive concept.

FIG. 9 is a structural view illustrating the supply module of the apparatus shown in FIG. 8 in accordance with an example embodiment of the present inventive concept.

Referring to FIG. 9, the supply module 600 may include a reservoir 610 in which the supercritical fluid may be generated by using a plurality of heaters and an electric power source 630 for driving the heaters. Thus, a source fluid may flow into the reservoir 610 and may be generated into the supercritical fluid SCF in the reservoir 610. Then, the supercritical fluid SCF may be supplied into the supercritical process chamber 500 for performing the supercritical process.

The reservoir 610 may comprise a steel tank having strength and rigidity sufficient for the supercritical process and may include a plurality of first heaters 611 that may be built in the wall of the reservoir 610 and a second heater 612 that may be protruded inside the reservoir 610 from a bottom thereof. The first and the second heaters 611 and 612 may be connected to the electric power source 630.

The source fluid may flow into the reservoir 610 to a reservoir pressure over a supercritical pressure of the source fluid and then may be heated by the first and the second heaters 611 and 612 to a reservoir temperature higher than the supercritical temperature of the source fluid. Thus, the source fluid may be transformed into the supercritical fluid SCF in the reservoir 610.

In the present example embodiment, the source fluid may include a liquefied carbon dioxide under a pressure of about 15 bar to about 25 bar and the supercritical fluid SCF may include a supercritical carbon dioxide.

The supercritical fluid SCF may be supplied into the supercritical process chamber 500 through a supercritical line SCL. The supercritical line SCL may include an upper supercritical line USCL (as illustrated in FIG. 8) that may be connected to an upper portion of the supercritical process chamber 500 and may transfer the supercritical fluid SCF over the substrate W and a lower supercritical line LSCL (as illustrated in FIG. 8) that may be connected to a lower portion of the supercritical process chamber 500 and may transfer the supercritical fluid SCF below the substrate W. The flow of the supercritical fluid SCF through the upper supercritical line USCL may be controlled by an upper valve UV and the flow of the supercritical fluid SCF through the lower supercritical line LSCL may be controlled by a lower valve LV.

At first, the supercritical fluid SCF may be supplied into the buffer space BS through the lower supercritical line LSCL and then may be supplied into the process chamber through both of the upper and the lower supercritical lines USCL and LSCL when the pressure gradient between the inner pressure of the process space PS and the pressure of the supercritical fluid SCF. Thus, the supercritical fluid SCF may be rapidly supplied to the supercritical process chamber 500 without any damages to the substrate W caused by the supercritical fluid SCF.

Then, the supercritical fluid SCF may be reacted with residual chemicals or solutions remaining on the substrate W in the process space PS and may provide supercritical byproducts in the supercritical process.

When the concentration of the chemicals or the solutions may be below a reference concentration in the supercritical process chamber 500, the inner pressure of the supercritical process chamber 500 may gradually degrade to a room pressure from the supercritical pressure and the supercritical byproducts may be discharged from the supercritical process chamber 500. The discharge flow rate of the byproducts may be controlled by the discharge valve DV.

The lower valve LV, the upper valve UV and the discharge valve DV may be systematically controlled by the process controller 700 according to the process conditions of the supercritical process chamber 500. In the present example embodiment, the lower valve LV, the upper valve UV and the discharge valve DV may include a valve assembly having a plurality of control valves.

Thus, the systematic control to the lower valve LV, the upper valve UV and the discharge valve DV by the process controller 700 according to the process conditions of the supercritical process chamber 500 and the supply module 600 may repeat the cycles of the supercritical process between the supply of the supercritical fluid SCF and the discharge of the supercritical byproducts, thereby performing the supercritical process in the supercritical process chamber 500.

When the process controller 700 may detect that the chemical concentration may be less than the reference concentration in the supercritical process chamber 500, the supply of the supercritical fluid SCF may be stopped by the process controller 700 and the byproducts may be discharged from the supercritical process chamber 500 by the process controller 700, thereby completing the supercritical process in the supercritical process chamber 500.

According to the example embodiments of the supercritical process chamber and an apparatus for treating substrates having the same, the process chamber may include the body and the cover that may be coupled to each other by a compressive force. The body may include the body frame and the inner vessel that may be detachably coupled to the body frame and the cover may include the cover frame and the inner cover that may be detachably coupled to the cover frame. The body and the cover may be coupled into the process chamber by the compressive force in such a configuration that the inner vessel may make contact with the inner cover without direct contact between the body frame and the cover frame. Thus, when the contact surface of the inner vessel and the inner cover may be grinded and damaged by the compressive force and the contaminant particles may be generated from the contact area together with the increase of the surface roughness, the inner vessel and the inner cover may be exchanged with new ones without exchanging the body frame and the cover frame. Accordingly, the damage or defect such as the high surface roughness of the contact area of the body and cover may be removed while the main body of the process chamber may still remain unchanged.

In addition, even when the contaminant particles may be generated from the contact area of the body and the cover of the process chamber, the inner vessel and the inner cover may be exchanged with new ones, so that the contaminant particles may be thoroughly prevented from flowing into the process space and thus the process defects due to the contaminant particles may be reduced in the supercritical process.

Particularly, when the body contact of the inner vessel and the cover contact of the inner cover may be individually provided with the process chamber as the body contact piece and the cover contact piece, the body contact and the cover contact may be locally exchanged instead of the whole of the body contact and the cover contact according to the individual and local failures thereof. Accordingly, the maintenance cost of the process chamber may be reduced and the exchange facility of the inner vessel and the inner cover may be improved by the body contact piece and the cover contact piece.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A supercritical process chamber for performing a supercritical process, comprising:
    a body frame having a protrusion protruding in an upward vertical direction from a first surface of the body frame and a recess defined by the protrusion and the first surface of the body frame;
    an inner vessel detachably fitted with the recess of the body frame such that the inner vessel is configured to conformally cover a surface profile of the recess, the inner vessel providing a chamber space in the recess;
    a cover frame;
    an inner cover detachably coupled to the cover frame such that the inner cover is configured to be in contact with a first surface of the inner vessel to enclose the chamber space; and
    a connector configured to couple the body frame and the cover frame,
    wherein the inner vessel and the inner cover are sequentially arranged between the body frame and the cover frame in the upward vertical direction from the first surface of the body frame such that the enclosed chamber space is transformed into a process space in which the supercritical process is performed, and wherein the inner vessel includes a body contact on the protrusion of the body frame, a size controller on a sidewall of the recess of the body frame configured to control a size of the chamber space and a vessel bottom on a bottom of the recess of the body frame.

2. The supercritical process chamber of claim 1, wherein a thickness of the size controller is non-uniform along at least one of a depth and a circumference of the recess.

3. The supercritical process chamber of claim 1, wherein the body contact, the size controller and the vessel bottom are configured to be integrally provided into one body such that the inner vessel includes a single vessel that covers the body frame along a surface profile of the protrusion and the recess.

4. The supercritical process chamber of claim 1, wherein the body contact and the size controller are configured to be separated from each other and the body contact is configured to be individually arranged on the body frame apart from the size controller.

5. The supercritical process chamber of claim 4, wherein the size controller and the vessel bottom are configured to be provided as a single vessel that is buried in the recess and the body contact is configured to be individually arranged on the protrusion apart from the size controller as an individual body contact piece.

6. The supercritical process chamber of claim 1, wherein the inner cover includes a cover contact making a surface contact with the body contact and the size controller of the inner vessel and a ceiling facing the vessel bottom and closing the chamber space from surroundings.

7. The supercritical process chamber of claim 6, wherein the cover contact and the ceiling are configured to be integrally provided into a single plate that has a uniform thickness in a direction perpendicular to the first surface of the body frame and covers a surface of the cover frame.

8. The supercritical process chamber of claim 6, wherein the cover contact is configured to be individually arranged on the body contact and the size controller apart from the ceiling as an individual cover contact piece.

9. The supercritical process chamber of claim 6, wherein the ceiling has a thickness smaller than the cover contact such that the inner cover has a ceiling recess defined by the cover contact and the process space expands to the ceiling recess from the chamber space.

10. An apparatus for treating a substrate, comprising:
a process chamber having a process space in which the substrate is processed by using a supercritical fluid;
a supply module supplying the supercritical fluid into the process space from an exterior of the process chamber; and
a process controller connected to the process chamber and the supply module and controlling a flow of the supercritical fluid according to process conditions in the process space,
wherein the process chamber includes:
a body frame having a protrusion protruding in an upward vertical direction from a first surface of the body frame and a recess defined by the protrusion and the first surface of the body frame;
an inner vessel detachably fitted with the recess of the body frame such that the inner vessel is configured to conformally cover a surface profile of the recess, the inner vessel providing a chamber space in the recess;
a cover frame;
an inner cover detachably coupled to the cover frame such that the inner cover is configured to be in contact with a first surface of the inner vessel enclosing the chamber space from surroundings; and
a connector configured to couple the body frame and the cover frame,
wherein the inner vessel and the inner cover are sequentially arranged between the body frame and the cover frame in the upward vertical direction from the first surface of the body frame such that the enclosed chamber space is transformed into a process space in which a supercritical process is performed, and
wherein the inner vessel includes a body contact on the protrusion of the body frame, a size controller on a sidewall of the recess of the body frame configured to control a size of the chamber space and a vessel bottom on a bottom of the recess of the body frame.

11. The apparatus of claim 10, wherein the size controller and the vessel bottom are configured to be provided as a single vessel that is buried in the recess and the body contact is configured to be individually arranged on the protrusion apart from the size controller as an individual body contact piece.

12. The apparatus of claim 10, wherein the inner cover includes a cover contact making a surface contact with the body contact and the size controller of the inner vessel and a ceiling facing the vessel bottom and closing the chamber space from surroundings.

13. The apparatus of claim 12, wherein the cover contact is configured to be individually arranged on the body contact and the size controller apart from the ceiling as an individual cover contact piece.

14. A supercritical process chamber for performing a supercritical process, comprising:
a body frame having a protrusion protruding in an upward vertical direction from a first surface of the body frame and a recess defined by the protrusion and the first surface of the body frame;
a cover frame;
a buffer chamber arranged between the body frame and the cover frame, the buffer chamber including an inner vessel detachably fitted with the recess of the body frame providing a chamber space in the recess and an inner cover detachably coupled to the cover frame such that the inner cover is configured to be in contact with a first surface of the inner vessel enclosing the chamber space from surroundings; and
a connector configured to couple the body frame and the cover frame,
wherein the buffer chamber is arranged therebetween such that the enclosed chamber space is transformed into a process space in which the supercritical process is performed, and
wherein the inner vessel includes a body contact configured to be positioned on the protrusion of the body frame, a size controller configured to be positioned on a sidewall of the recess of the body frame and a vessel bottom configured to be positioned on a bottom of the body frame.

15. The supercritical process chamber of claim 14, wherein the recess is configured to be reduced into the chamber space by the size controller.

16. The supercritical process chamber of claim 14, wherein the inner vessel has a first thickness in a direction perpendicular to an uppermost surface of the body frame, the size controller has a second thickness in a direction parallel to the uppermost surface of the body frame and the vessel bottom has a third thickness in the direction perpendicular to the uppermost surface of the body frame.

17. The supercritical process chamber of claim 16, wherein the second thickness is greater than both the first thickness and the third thickness and the third thickness is smaller than the first thickness.

\* \* \* \* \*